United States Patent
Cabanillas

(10) Patent No.: US 7,154,349 B2
(45) Date of Patent: Dec. 26, 2006

(54) COUPLED-INDUCTOR MULTI-BAND VCO

(75) Inventor: Jose Cabanillas, San Diego, CA (US)

(73) Assignee: Qualcomm, Incorporated, San Diego, CA (US)

( * ) Notice: Subject to any disclaimer, the term of this patent is extended or adjusted under 35 U.S.C. 154(b) by 0 days.

(21) Appl. No.: 10/982,635

(22) Filed: Nov. 4, 2004

(65) Prior Publication Data

US 2006/0033587 A1     Feb. 16, 2006

Related U.S. Application Data

(60) Provisional application No. 60/600,511, filed on Aug. 11, 2004.

(51) Int. Cl.
*H03B 5/12* (2006.01)
*H03B 5/18* (2006.01)

(52) U.S. Cl. ............................ 331/117 R; 331/117 FE; 331/177 V; 331/179

(58) Field of Classification Search ............ 331/117 R, 331/117 FE, 117 D, 167, 177 R, 177 V, 179
See application file for complete search history.

(56) References Cited

U.S. PATENT DOCUMENTS

| | | | | |
|---|---|---|---|---|
| 2,647,252 A | * | 7/1953 | Moore, Jr. | 340/688 |
| 2,994,864 A | * | 8/1961 | Van Allen | 341/149 |
| 3,001,129 A | * | 9/1961 | Knowles | 324/236 |
| 3,229,229 A | * | 1/1966 | Tozzi | 332/141 |
| 3,289,074 A | * | 11/1966 | Jones | 324/541 |
| 3,413,560 A | * | 11/1968 | Van Aurooy | 329/344 |
| 3,509,485 A | * | 4/1970 | Czerny | 331/65 |
| 6,121,850 A | | 9/2000 | Ghoshal | |
| 6,133,798 A | | 10/2000 | Nagano et al. | |
| 6,215,374 B1 | * | 4/2001 | Petrovic | 333/177 |
| 6,621,365 B1 | * | 9/2003 | Hallivuori et al. | 331/179 |
| 6,791,423 B1 | * | 9/2004 | Leenaerts et al. | 331/113 R |
| 6,943,635 B1 | * | 9/2005 | Kaltenecker | 331/108 D |
| 2002/0109556 A1 | | 8/2002 | Leenaerts et al. | |
| 2004/0196110 A1 | | 10/2004 | Boccuzzi et al. | |
| 2006/0033587 A1 | * | 2/2006 | Cabanillas | 331/108 C |

FOREIGN PATENT DOCUMENTS

WO         03005559         1/2003

OTHER PUBLICATIONS

Straayer et al. A Low-Noise Transformer-Based 1.7GHz CMOS VCO, ISSCC 2002; Session 17, Advanced RF Techniques, 17.1; EECS Department, University of Michigan.

* cited by examiner

*Primary Examiner*—David Mis
(74) *Attorney, Agent, or Firm*—Philip R. Wadsworth; Charles D. Brown; Alex C. Chen

(57) ABSTRACT

A multi-band VCO employs a coupled-inductor based resonator having $N \geq 2$ ports. Each port has an inductor and at least one capacitor. The N inductors for the N ports are magnetically coupled. The inductors/ports may be selectively enabled and disabled to allow the VCO to operate at different frequency bands. The capacitor(s) for each port may include one or more fixed capacitors, one or more variable capacitors (varactors), one or more switchable capacitors, or any combination of fixed, variable, and switchable capacitors. The switchable capacitors (if any) in the enabled ports may be selectively enabled and disabled to vary the VCO oscillation frequency. The varactors (if any) in the enabled ports can vary the oscillation frequency to lock the VCO to a desired frequency. The multi-band VCO may be implemented with various oscillator topologies and can replace multiple single-band VCOs.

32 Claims, 9 Drawing Sheets

COUPLED-INDUCTOR MULTI-BAND VCO

This application claims the benefit of provisional U.S. Application Ser. No. 60/600,511; entitled "An Inductor-Coupled Multi-Band Tunable VCO," filed Aug. 11, 2004.

BACKGROUND

I. Field

The present invention relates generally to circuits, and more specifically to a voltage controlled oscillator (VCO).

II. Background

Wireless communication systems are widely deployed to provide various communication services such as voice, packet data, and so on. These systems may implement various wireless standards and may operate in various frequency bands that may be spaced far apart. A given system may also operate at different frequencies in different geographic areas (e.g., different countries).

A wireless device (e.g., a cellular phone or a handset) may need to operate at multiple frequency bands and support multiple standards in order to communicate with second and third generation wireless communication systems that are widely deployed throughout the world. The wireless device has at least one radio frequency (RF) front-end to generate an RF output signal for transmission via a wireless link and to process an RF input signal received via the wireless link. Each system/standard typically imposes stringent requirements on the RF output signal to ensure good performance. The tight specifications imposed by each system/standard normally prevent the use of a single RF front-end for all frequency bands and standards supported by the wireless device, which would be an optimum solution in terms of circuit area, complexity, and cost. Instead, a multi-band, multi-standard wireless device normally duplicates some circuit blocks or even an entire RF front-end for each supported standard and/or frequency band.

An RF front-end typically has at least one VCO to generate local oscillator (LO) signals used for frequency upconversion and downconversion. The VCO typically has an LC resonator composed of an inductor (L) and one or more capacitors (C). The oscillation frequency of the VCO, and hence the frequency of the LO signal, may be varied by adjusting a variable capacitor (varactor) within the LC resonator. The range of frequencies (or the tuning range) achieved with the varactor is typically small and is often used to account for variations in integrated circuit (IC) process, temperature, power supply, and so on.

To support multi-band operation, the LC resonator typically includes a bank of capacitors that may be selectively switched on or off to shift the nominal frequency of the VCO to different frequency bands. A VCO with a switch capacitor bank can achieve good performance when the frequency bands of interest are relatively close to each other, e.g., within 10 to 20% of each other. However, when the frequency bands are sufficiently far apart, a large range of capacitances is needed to tune the VCO to the different frequency bands. The large capacitance range translates to a large variation in the peak impedance of the LC resonator, which in turn causes a relatively large and undesirable variation in the VCO amplitude and phase noise over the different frequency bands.

A multi-band wireless device may employ multiple VCOs to support operation on multiple frequency bands. Each VCO may then be designed to achieve good performance for a specific frequency band. However, the use of multiple VCOs for multiple frequency bands increases cost, system complexity, and circuit area, all of which are undesirable.

There is therefore a need in the art for a multi-band VCO having good performance.

SUMMARY

A multi-band VCO employing a coupled-inductor based resonator and having good performance for a wide range of frequencies is described herein. The coupled-inductor based resonator replaces the LC resonator commonly found in many VCOs and can increase the VCO tunnability without degrading (or, in some cases improving) the phase noise performance for the VCO. The coupled-inductor based resonator has N ports, where in general $N \geq 2$. One port couples to the VCO circuitry and is called the first or primary port, and the remaining ports are called secondary ports. Each port has an inductor, and the N inductors for the N ports are magnetically coupled. The inductors/ports may be selectively enabled and disabled to allow the VCO to operate at different frequency bands. Each secondary port also has at least one capacitor, and the primary port may or may not have a capacitor. The capacitor(s) for each port may include (1) one or more fixed capacitors having fixed capacitances and being always coupled across the inductor for the port, (2) one or more varactors having variable capacitances, (3) one or more switchable capacitors that may be connected and disconnected to the inductor via switches, or (4) any number and any combination of fixed, variable, and switchable capacitors. The switchable capacitors (if any) in the enabled ports may be selectively enabled and disabled to vary the VCO oscillation frequency. The varactors (if any) in the enabled ports can vary the oscillation frequency to lock the VCO to a desired frequency. A single multi-band VCO can replace multiple single-band VCOs, which is highly desirable for reduced cost, circuit area, and complexity.

The multi-band VCO and coupled-inductor based resonator may be implemented with various oscillator topologies and may also be fabricated with various IC technologies and/or with discrete components.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

A VCO may be implemented with various designs known in the art. Some VCO designs are more suitable for radio RF, some designs are more suitable for fabrication on an IC, some designs can provide better phase noise performance, and so on. A VCO may also be designed to operate at multiple frequency bands, with the specific frequencies being dependent on the requirements of the systems and standards for which the VCO is used. An exemplary VCO design is described below.

Figure 1:
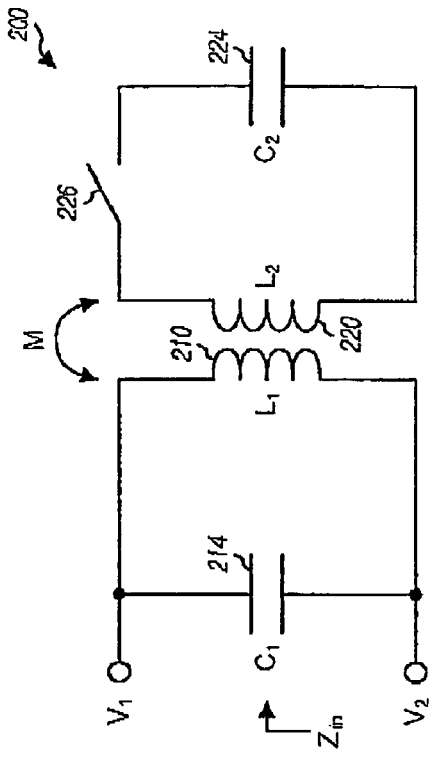
FIG. 1 shows a VCO with an amplifier and an LC resonator.

FIG. 1 shows a schematic diagram of a VCO 100 comprised of an amplifier 110 and an LC resonator 120. For simplicity, FIG. 1 shows LC resonator 120 being formed by a single inductor 130 and a single capacitor 140 coupled in parallel. Amplifier 110 provides the signal gain needed for oscillation. Amplifier 110 and LC resonator 120 collectively provide the 360° phase shift needed for oscillation. VCO 100 provides an oscillator signal (Osc) having a fundamental frequency of $f_{osc}$. The oscillation frequency $f_{osc}$ is determined predominantly by the inductance (L) of inductor 130 and the capacitance (C) of capacitor 140 and may be expressed as:

$$f_{osc} = \frac{1}{2\pi\sqrt{L \cdot C}}. \quad \text{Eq (1)}$$

A coupled-inductor based resonator may be used in place of LC resonator 120 in FIG. 1 to allow for operation in multiple frequency bands and to provide good performance for all of the frequency bands. The coupled-inductor based resonator, which is also called a transformer-based resonator or a switchable coupled-inductor resonator, has N coupled inductors for N ports, where $N \geq 2$. At least one of the N ports may be selectively switched on and off.

Figure 2B:
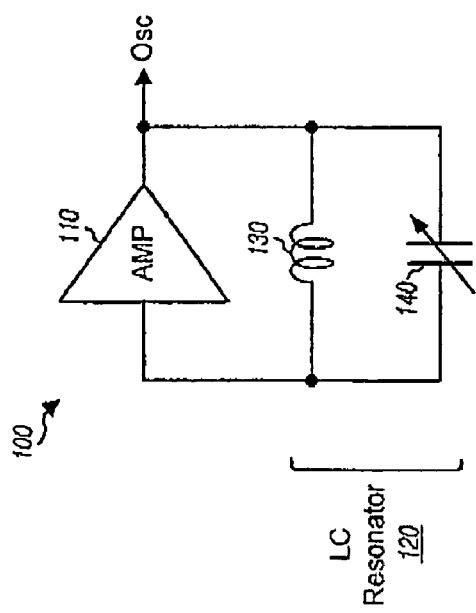
FIGS. 2B and 2C show models of the resonator in FIG. 2A with the second port disabled and enabled, respectively.
Figure 2A:
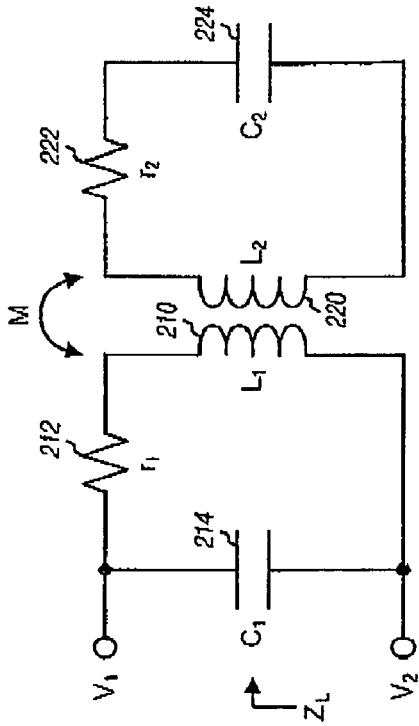
FIG. 2A shows a resonator with two coupled inductors.

FIG. 2A shows a schematic diagram of a coupled-inductor based resonator 200 with two coupled inductors (or N=2). Resonator 200 includes (1) a first port having an inductor 210 coupled in parallel with a capacitor 214 and (2) a second port having an inductor 220 coupled in series with a capacitor 224 and a switch 226. Inductors 210 and 220 are magnetically coupled and may be viewed as the primary and secondary ports, respectively, of a 2-port transformer. Capacitors 214 and 224 may each be implemented with one or more fixed capacitors, one or more varactors, one or more switchable capacitors, or any combination thereof. Switch 226 may be selectively opened or closed to disable or enable, respectively, the second port, which then varies the electrical characteristics of resonator 200. Nodes $V_1$ and $V_2$ represent the output of resonator 200.

For the embodiment shown in FIG. 2A, inductors 210 and 220 have inductances of $L_1$ and $L_2$, respectively, and capacitors 214 and 224 have capacitances of $C_1$ and $C_2$, respectively. The mutual inductance M of inductors 210 and 220 may be given as $M = k \cdot \sqrt{L_1 \cdot L_2}$, where k is the coupling factor (or coupling coefficient) between inductors 210 and 220. Resonator 200 has two resonant frequencies $\omega_a$ and $\omega_b$, which may be expressed as:

$$\omega_{a,b}^2 = \frac{-(L_1 C_1 + L_2 C_2) \pm \sqrt{(L_1 C_1 + L_2 C_2)^2 + 4C_1 C_2(M^2 - L_1 L_2)}}{2C_1 C_2(M^2 - L_1 L_2)}, \quad \text{Eq (2)}$$

where resonant frequency $\omega_a$ is obtained with the plus (+) sign in front of the square root quantity in equation (2) and resonant frequency $f\omega_7$ is obtained with the minus (−) sign in front of the square root quantity. Equation (2) assumes that inductors 210 and 220 are ideal and have no loss. Resonator 200 is typically used at resonant frequency $\omega_a$ instead of $\omega_b$ because the quality factor (Q) and the resonator peak impedance at $\omega_a$ are higher than at $\omega_b$. However, resonator 200 is not restricted to $\omega_a$ and may also be used at $\omega_b$.

Inductors 210 and 220 typically have some losses that may be modeled with resistors having resistances of $r_1$ and $r_2$, respectively. The input impedance $Z_{in}$ looking into nodes $V_1$ and $V_2$ may be expressed as:

$$Z_{in} = \frac{(M^2 - L_1 L_2)\omega^2 + \frac{L_1}{C_2} + r_1 r_2 + j\left(\omega L_1 r_2 + \omega L_2 r_1 - \frac{r_1}{\omega C_2}\right)}{r_2 - \omega C_1\left(\omega L_1 r_2 + \omega L_2 r_1 - \frac{r_1}{\omega C_2}\right) + j\left[\omega C_1\left((M^2 - L_1 L_2)\omega^2 + \frac{L_1}{C_2} + r_1 r_2\right) + \omega L_1 - \frac{r_1}{\omega C_2}\right]}. \quad \text{Eq (3)}$$

In general, inductors 210 and 220 may have the same or different inductances, and capacitors 214 and 224 may also have the same or different capacitances. For simplicity, the following description assumes that the inductances are equal so that $L_1 = L_2 = L$, the capacitances are equal so that $C_1 = C_2 = C$, and the internal resistances are also equal so that $r_1 = r_2 = r$.

FIG. 2B shows a model of coupled-inductor based resonator 200 with switch 226 opened. In this configuration, no current flows through inductor 220, the second port is disabled, and resonator 200 is equivalent to LC resonator 120 in FIG. 1. A resistor 212 models the internal resistance of inductor 210. The resonant frequency $\omega_H$ and the peak impedance $Z_H$ of resonator 200, with switch 226 opened, may be expressed as:

$$\omega_H = \frac{1}{\sqrt{L \cdot C}}, \text{ and} \qquad \text{Eq (4)}$$

$$Z_H = \frac{L}{r \cdot C}. \qquad \text{Eq (5)}$$

The resonant frequency $\omega_H$ determines the oscillation frequency of a VCO that uses resonator 200. The peak impedance $Z_H$ is the input impedance looking into nodes $V_1$ and $V_2$ at the resonant frequency $\omega_H$. The peak impedance $Z_H$ affects the VCO amplitude, which in turn affects the phase noise of the VCO.

Figure 2C:
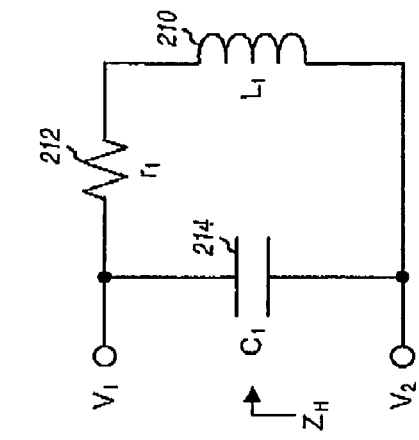

FIG. 2C shows a model of coupled-inductor based resonator 200 with switch 226 closed. In this configuration, the second port is enabled and resonator 200 includes both inductors 210 and 220. A resistor 222 models the internal resistance of inductor 220. The resonant frequency $\omega_L$ and the peak impedance $Z_L$ of resonator 200, with switch 226 closed, may be expressed as:

$$\omega_L = \frac{1}{\sqrt{(L+M) \cdot C}}, \text{ and} \qquad \text{Eq (6)}$$

$$Z_L = \frac{(L+M)}{2r \cdot C}. \qquad \text{Eq (7)}$$

The resonant frequency $\omega_L$ may be obtained from equation (2) by setting $L_1=L_2=L$, $C_1=C_2=C$, and $\omega_L=\omega_a$. The peak impedance $Z_L$ may be obtained from equation (3) by setting $L_1=L_2=L$, $C_1=C_2=C$, and $\omega=1/\sqrt{(L+M) \cdot C}$.

For simplicity, FIGS. 2A through 2C show (1) an ideal capacitor 224 with no parasitic capacitance and (2) an ideal switch 226 with no series resistance and no parasitic capacitance. In a practical implementation, switches and capacitors have some parasitic capacitance. Thus, some current can flow through the parasitic capacitances in the secondary ports even if these ports are switched off. Each port may be considered as having a fixed parasitic capacitance that is always present. This parasitic capacitance limits the maximum frequency swing that is achievable in a practical implementation. The capacitance for each port may be designed to take into account the parasitic capacitance for the port. For simplicity, the following description assumes that ideal capacitors and switches are used in the secondary ports and does not consider parasitic capacitance and series resistance.

As shown in equations (4) and (6), two different resonant frequencies $\omega_H$ and $\omega_L$ may be obtained with switch 226 opened and closed, respectively. The ratio of the two resonant frequencies $\omega_H$ and $\omega_L$ may be expressed as:

$$\frac{\omega_H}{\omega_L} = \sqrt{\frac{(L+M)}{L}} = \sqrt{1+k}, \qquad \text{Eq (8)}$$

where k is the coupling factor, which ranges from 0 to 1, or $0 \leq k \leq 1$. Equations (4), (6), and (8) indicate that the desired resonant frequencies $\omega_H$ and $\omega_L$ may be obtained by selecting the proper inductance and capacitance values and the proper coupling factor k. Equations (5) and (7) indicate that the desired peak impedances at frequencies $\omega_H$ and $\omega_L$ may be obtained by selecting the proper inductance and capacitance values and the proper coupling factor k. The proper values for the inductors, capacitors, and coupling factor may be obtained via computer simulation, empirical measurement, and so on.

Resonator 200 may also be viewed as having two resonator tanks for the two ports. The two resonator tanks are magnetically coupled. Each resonator tank has a self-resonant frequency, which is a resonant frequency determined solely by the inductance and capacitance for the port.

Figure 3A:
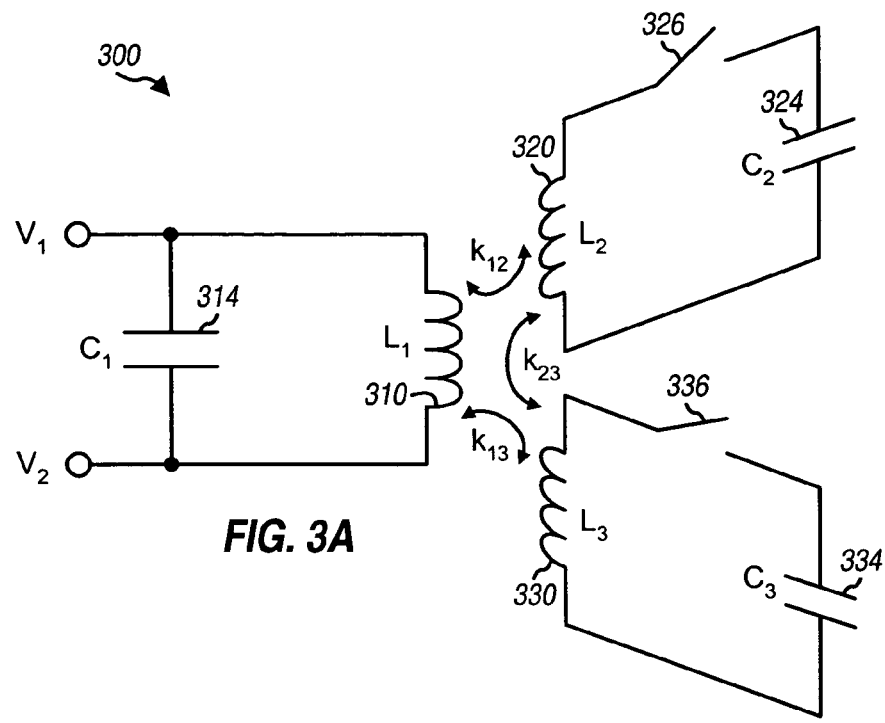
FIG. 3A shows a resonator with three coupled inductors.

FIG. 3A shows a schematic diagram of a coupled-inductor based resonator 300 with three coupled inductors (or N=3). Resonator 300 includes (1) a first port having an inductor 310 coupled in parallel with a capacitor 314, (2) a second port having an inductor 320 coupled in series with a capacitor 324 and a switch 326, and (3) a third port having an inductor 330 coupled in series with a capacitor 334 and a switch 336. Inductors 310, 320, and 330 are magnetically coupled and may be viewed as the primary, secondary, and tertiary ports, respectively, of a 3-port transformer. Inductors 310 and 320 have a coupling factor of $k_{12}$, inductors 310 and 330 have a coupling factor of $k_{13}$, and inductors 320 and 330 have a coupling factor of $k_{23}$. Capacitors 314, 324, and 334 may each be implemented with one or more fixed capacitors, one or more varactors, one or more switchable capacitors, or any combination thereof. Switches 326 and 336 may be individually opened or closed to selectively disable or enable the second and third ports, respectively, which would then vary the electrical characteristics of resonator 300. Nodes $V_1$ and $V_2$ represent the output of resonator 300.

For the embodiment shown in FIG. 3A, inductors 310, 320 and 330 have inductances of $L_1$, $L_2$ and $L_3$, respectively, and capacitors 314, 324 and 334 have capacitances of $C_1$, $C_2$ and $C_3$, respectively. The mutual inductance $M_{ij}$ for any two ports i and j, where i=1, 2, 3, j=1, 2, 3, and i≠j, may be given as $M_{ij}=k_{ij} \cdot \sqrt{L_i \cdot L_j}$, where $k_{ij}$ is the coupling factor between ports i and j. In general, inductors 310, 320 and 330 may have the same or different inductances, and capacitors 314, 324 and 334 may also have the same or different capacitances.

Different resonant frequencies may be obtained by controlling the state of switches 326 and 336. Up to four different configurations may be obtained with two switches 326 and 336, as described below.

Figure 3B:
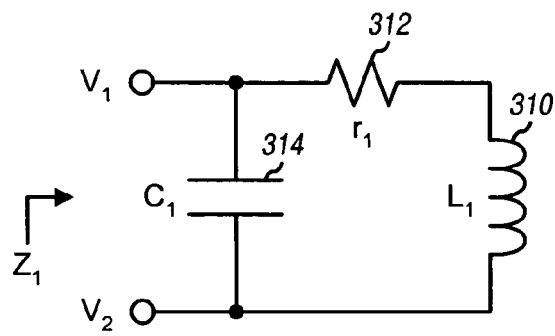
FIGS. 3B through 3E show models of the resonator in FIG. 3A with different ports disabled and enabled.

FIG. 3B shows a model of coupled-inductor based resonator 300 with both switches 326 and 336 opened. In this configuration, the second and third ports are both disabled, and resonator 300 is equivalent to an LC resonator. A resistor 312 models the internal resistance of inductor 310 and has a resistance of $r_1$. The resonant frequency $\omega_1$ and the peak impedance $Z_1$ of resonator 300, for this configuration, may be expressed as shown in equations (4) and (5), respectively, or $\omega_1=\omega_H$ and $Z_1=Z_H$.

Figure 3C:
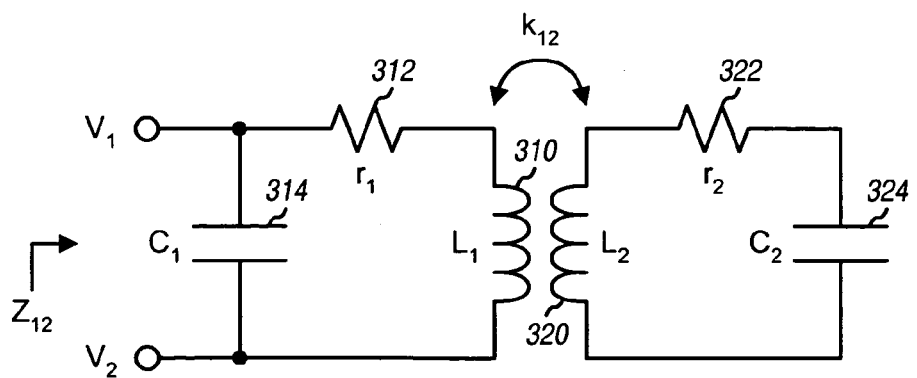

FIG. 3C shows a model of coupled-inductor based resonator 300 with switch 326 closed and switch 336 opened. In this configuration, the second port is enabled, the third port is disabled, and resonator 300 includes inductors 310 and 320. A resistor 322 models the internal resistance of inductor 320 and has a resistance of $r_2$. If $L_1=L_2=L$, $C_1=C_2=C$, $r_1=r_2=r$, and $k_{12}=k$, then the resonant frequency $\omega_{12}$ and the peak impedance $Z_{12}$ of resonator 300, for this configuration, may be expressed as shown in equations (6) and (7), respectively, or $\omega_{12}=\omega_L$ and $Z_{12}=Z_L$.

Figure 3D:
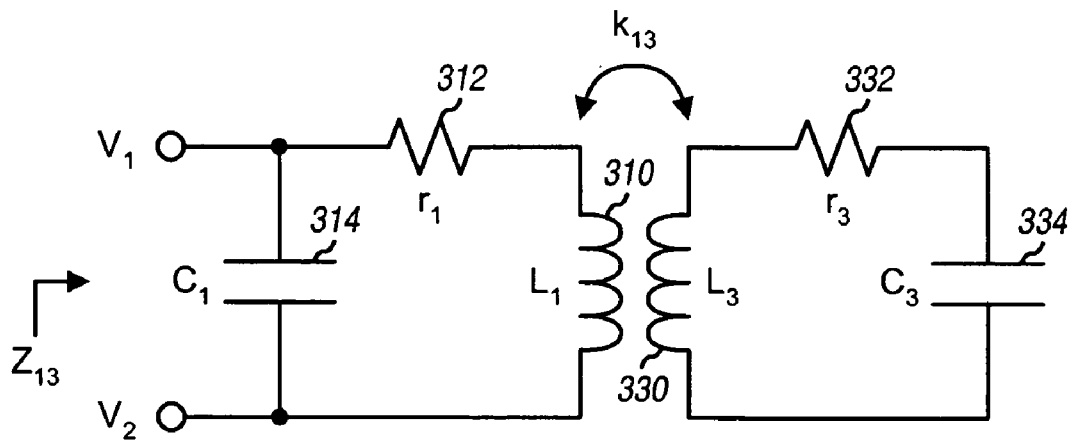

FIG. 3D shows a model of coupled-inductor based resonator 300 with switch 326 opened and switch 336 closed. In this configuration, the second port is disabled, the third port is enabled, and resonator 300 includes inductors 310 and 330. A resistor 332 models the internal resistance of inductor 330 and has a resistance of $r_3$. If $L_1=L_3=L$, $C_1=C_3=C$, $r_1=r_3=r$, and $k_{13}=k$, then the resonant frequency $\omega_3$ and the peak impedance $Z_{13}$ of resonator 300, for this configuration, may be expressed as shown in equations (6) and (7), respectively, or $\omega_{13}=\omega_L$ and $Z_{13}=Z_L$.

Figure 3E:
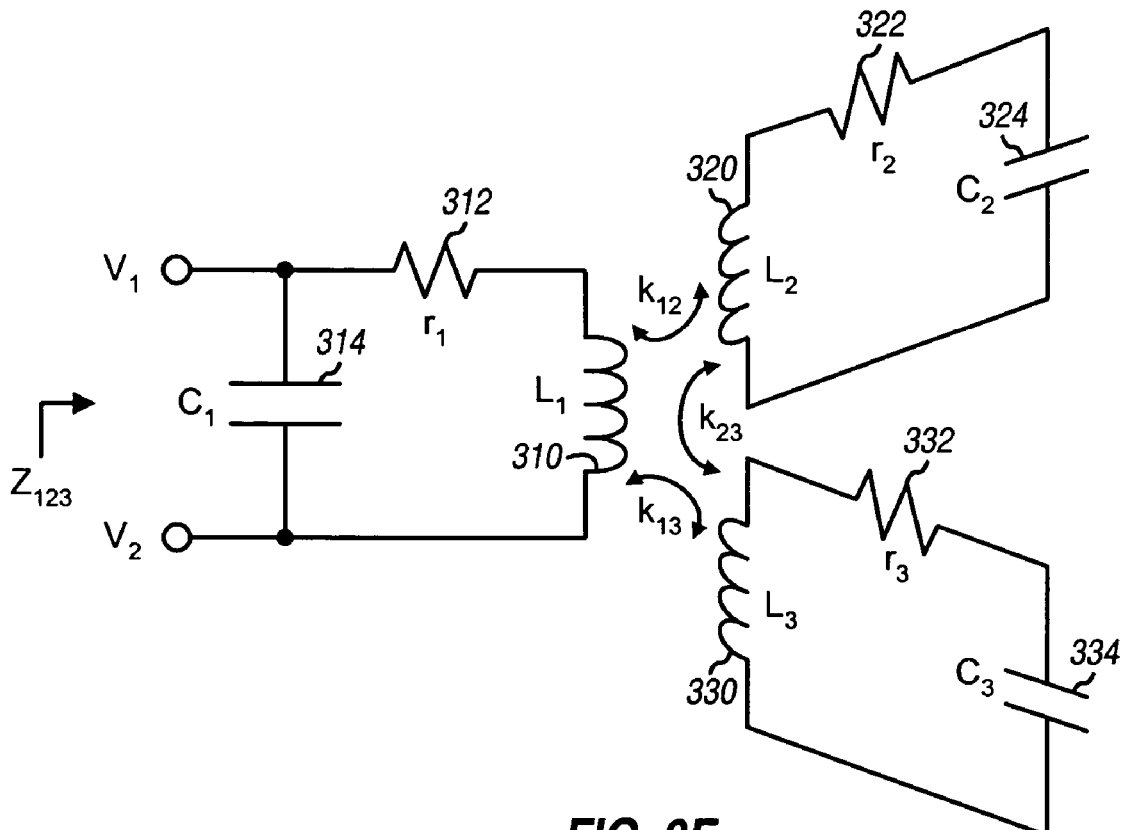

FIG. 3E shows a model of coupled-inductor based resonator 300 with both switches 326 and 336 closed. In this configuration, the second and third ports are both enabled, and resonator 300 includes all three inductors 310, 320 and 330. If $L_1=L_2=L_3=L$, $C_1=C_2=C_3=C$, $r_1=r_2=r_3=r$, and $k_{12}=k_{13}=k_{23}=k$, then the resonant frequency $\omega_{123}$ and the peak impedance $Z_{123}$ of resonator 300, for this configuration, may be expressed as:

$$\omega_{123} = \frac{1}{\sqrt{(L+2M)\cdot C}}, \text{ and} \qquad \text{Eq (9)}$$

$$Z_{123} = \frac{(L+2M)}{3r\cdot C}. \qquad \text{Eq (10)}$$

In FIG. 3A, the first port is shown having capacitor 314 coupled in parallel with inductor 310. Capacitor 314 may be omitted from the first port, which does not need to resonate. If capacitor 314 is omitted from resonator 300 and the second and third ports are enabled, then the impedance looking into the first port is similar to the impedance obtained for resonator 200 with two coupled inductors (N=2).

Figure 4:
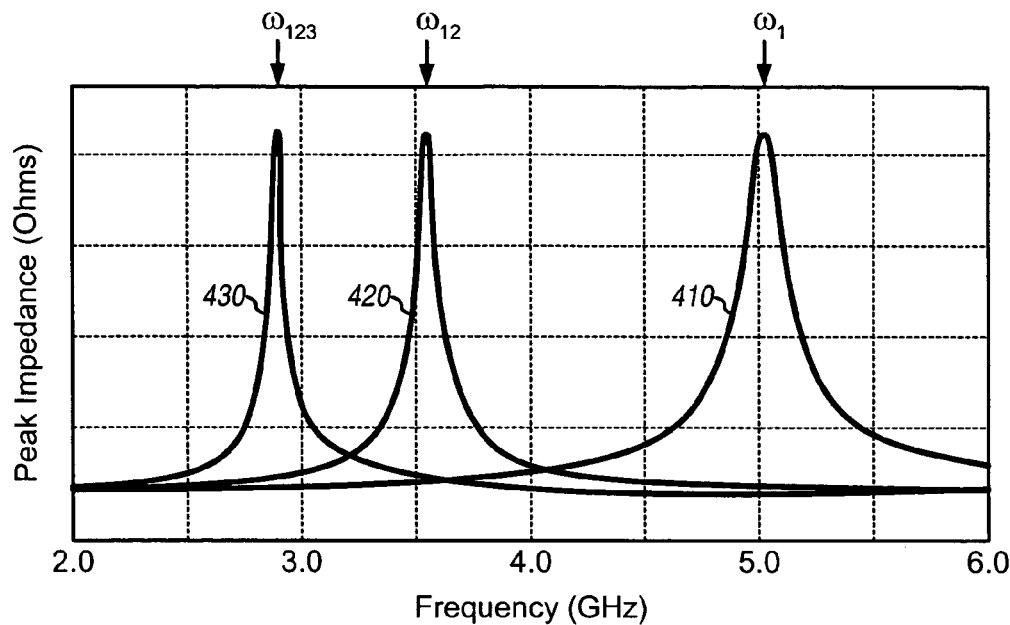
FIG. 4 shows plots of the peak impedance for the resonator in FIG. 3A.

FIG. 4 shows plots of the peak impedance of coupled-inductor based resonator 300 for different configurations of switches 326 and 336. For the exemplary design illustrated in FIG. 4, inductors 310, 320 and 330 have inductances of $L_1=L_2=L_3=1$ nano Henry (nH), capacitors 314, 324 and 334 have capacitances of $C_1=C_2=C_3=1$ pico Farad (pF), the coupling factors are $k_{12}=k_{13}=k_{23}=1$, resistors 312, 322 and 332 have resistances of $r_1=r_2=r_3=1$ Ohm (Ω), and switches 326 and 336 are ideal and have no losses.

Plot 410 shows the peak impedance of resonator 300 for the configuration shown in FIG. 3B with both switches 326 and 336 opened. Plot 420 shows the peak impedance of resonator 300 for the configuration shown in FIG. 3C with switch 326 closed and switch 336 opened. Plot 430 shows the peak impedance of resonator 300 for the configuration shown in FIG. 3E with both switches 326 and 336 closed. The peak impedances for the three configurations occur at resonant frequencies of $\omega_1$, $\omega_{12}$ and $\omega_{123}$, as shown in FIG. 4.

FIG. 4 indicates that a wide range of resonant frequencies may be obtained with coupled-inductor based resonator 300. FIG. 4 also indicates that the peak impedance is approximately constant or changes smoothly for the three configurations. This peak impedance characteristic makes it easier to optimize the VCO for good phase noise performance at all three resonant frequencies.

Figure 5:
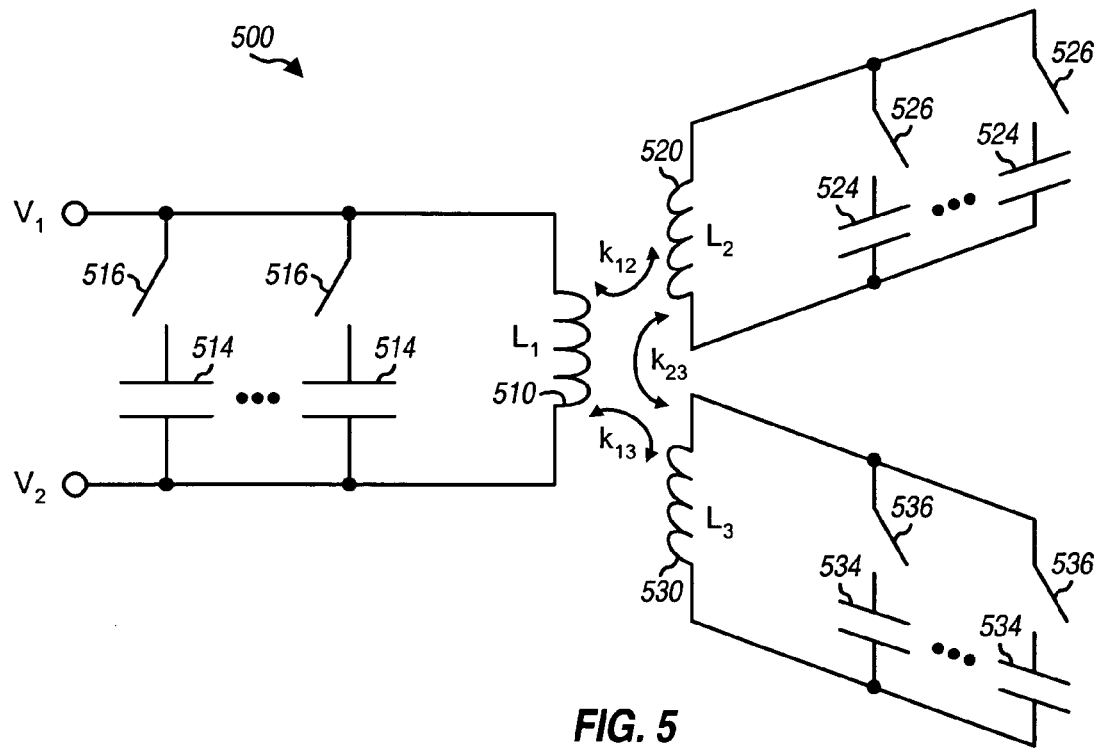
FIG. 5 shows a resonator with three coupled inductors and a bank of switchable capacitors for each port.

FIG. 5 shows a schematic diagram of a coupled-inductor based resonator 500 with three coupled inductors (or N=3) and three banks of switchable capacitors. Resonator 500 includes (1) a first port having an inductor 510 coupled in parallel with a bank of one or more switchable capacitors 514 and switches 516, (2) a second port having an inductor 520 coupled in series with a bank of one or more switchable capacitors 524 and switches 526, and (3) a third port having an inductor 530 coupled in series with a bank of one or more switchable capacitors 534 and switches 536. Inductors 510, 520 and 530 are magnetically coupled and may be viewed as the primary, secondary, and tertiary ports, respectively, of a 3-port transformer. The internal resistances of inductors 510, 520 and 530 may be modeled with three resistors, as shown in FIG. 3E. The capacitor bank for each port includes one or more switchable capacitors. Each switchable capacitor may be selectively enabled or disabled to vary the resonant frequency of resonator 500. Although not shown in FIG. 5, a fixed capacitor may be coupled across inductor 510 at all times, so that the first port is enabled even if all switchable capacitors 514 are disconnected via their associated switches 516.

Switches 526 and 536 may be individually opened and closed to select different frequency bands of operation for resonator 500. For each port that is enabled, the switchable capacitors for that port may be selectively enabled and disabled to vary the resonant frequency. Although not shown in FIG. 5, each port (e.g., the first port) may also include one or more varactors to vary the resonant frequency of resonator 500. For resonator 500, the three inductors 510, 520 and 530 may be used for coarse frequency tuning, the switchable capacitors 514, 524 and 534 may be used for fine tuning, and the varactor(s) may be used for frequency acquisition and tracking.

For the embodiment shown in FIG. 5, one or more switchable capacitors are coupled in parallel with inductor 510. The switchable capacitors in the first port may be used to achieve different resonant frequencies between the highest resonant frequency $\omega_1$ (which is obtained with just the first port enabled) and the next highest resonant frequency $\omega_{12}$ (which is typically obtained with two ports enabled). Switchable capacitors may be used for the first port, for example, if the separation between the highest resonant frequency $\omega_1$ and the next highest resonant $\omega_{12}$ is large, or if design considerations suggest that switchable capacitors should be included.

Figure 6:
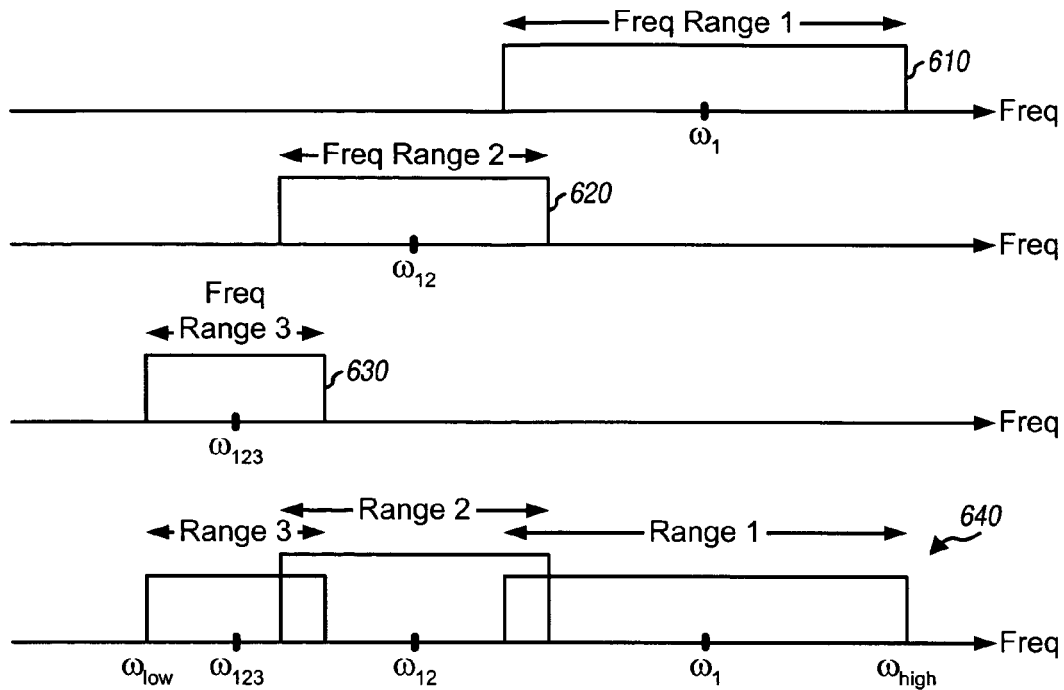
FIG. 6 shows plots of the frequencies achieved by the resonator in FIG. 5.

FIG. 6 shows plots of the resonant frequencies achieved by resonator 500 in FIG. 5. Plot 610 represents the range of resonant frequencies achieved by inductor 510 for the first port, with the second and third ports disabled by opening switches 526 and 536. The entire frequency range for plot 610 is achieved by enabling and disabling switchable capacitors 514 in the first port. Plot 620 represents the range of resonant frequencies achieved by inductors 510 and 520 for the first and second ports, with the third port disabled by opening switch 536. The entire frequency range for plot 620 is achieved by enabling and disabling switchable capacitors 514 and 524 in the first and second ports, respectively. Plot 630 represents the range of resonant frequencies achieved by all three inductors 510, 520 and 530 for the three ports. The frequency range for plot 630 is achieved by enabling and disabling switchable capacitors 514, 524 and 534 in the first, second and third ports, respectively. Plot 640 shows the total range of resonant frequencies achieved by resonator 500. If the three frequency ranges for plots 610, 620 and 630 are sufficiently wide, then these frequency ranges will overlap at the edges, as shown in FIG. 6. In this case, the use of switchable capacitors allows resonator 500 to achieve a continuous and wide range of resonant frequencies. A VCO with resonator 500 may then be used for various frequency bands between the lower frequency of $\omega_{low}$ and the upper frequency of $\omega_{high}$.

For the embodiment shown in FIG. 6, the three ports in resonator 500 are selectively enabled to obtain the three frequency ranges. The smallest capacitance in the first port determines the highest resonant frequency in plot 610. The smallest capacitance in the first and second ports determines the highest resonant frequency in plot 620. The smallest capacitance in the first, second, and third ports, which may be a relatively large capacitance value, determines the highest resonant frequency in plot 630. In another embodiment, all three ports are selected at all times. The highest resonant frequency is achieved with the smallest capacitance each of the three ports, and lowest resonant frequency is achieved with the highest capacitance each of the three ports. The three ports may be designed with the same number of switchable capacitors, and these capacitors may be enabled in unison. For example, the first capacitor in all three ports may be enabled, then the second capacitor in all three ports may be enabled to achieve the next lower resonant frequency range, then the third capacitor in all three ports may be enabled to achieve the next lower resonant frequency range, and so on.

FIGS. 2A, 3A and 5 show three different coupled-inductor based resonators with two and three coupled inductors. In general, a coupled-inductor based resonator may have any number of coupled inductors.

Figure 7:
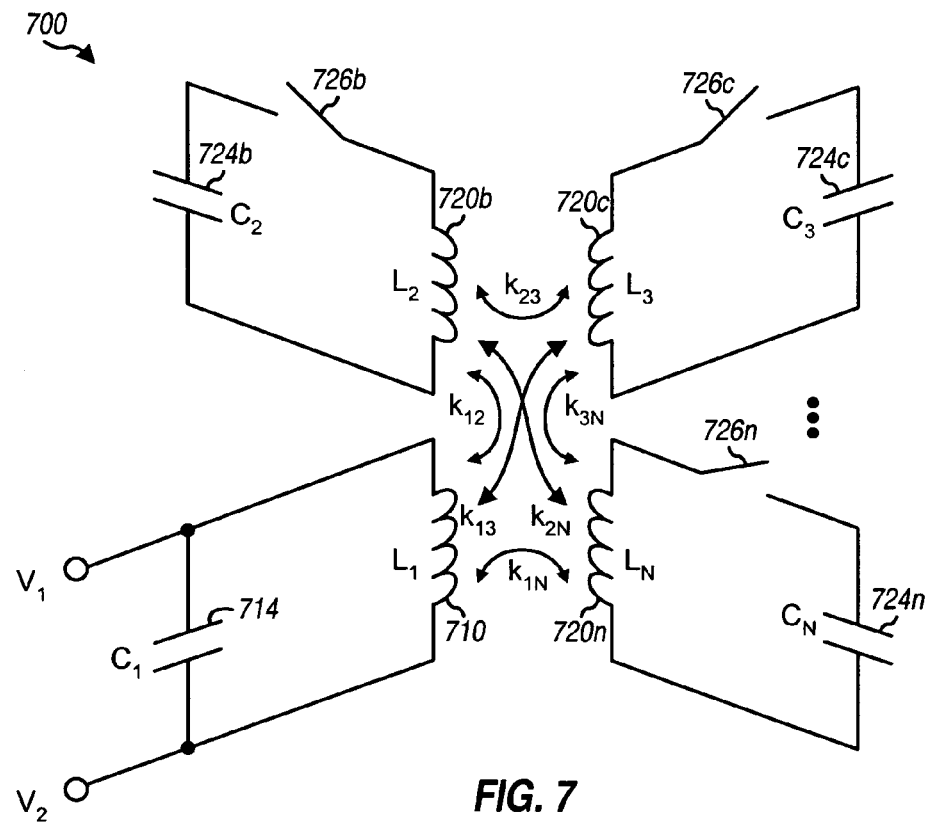
FIG. 7 shows a resonator with N coupled inductors, where N>3.

FIG. 7 shows a schematic diagram of a coupled-inductor based resonator 700 with N coupled inductors, where N>3 for this embodiment. Resonator 700 includes (1) a first port having an inductor 710 coupled in parallel with a capacitor 714 and (2) N−1 secondary ports, with each secondary port having an inductor 720 coupled in series with a capacitor 724 and a switch 726. The N inductors are magnetically coupled, and the coupling factor for any pair of inductors i, j is given as $k_{ij}$. Resonator 700 may be viewed as having N resonator tanks for the N ports. The N resonator tanks are magnetically coupled. Each resonator tank has a self-resonant frequency determined by the inductance and capacitance for the port. Capacitor 714 in the first port may be omitted, in which case resonator 700 would have N−1 resonator tanks for the N−1 secondary ports and no resonator tank for the first port.

For a coupled-inductor based resonator with N coupled inductors, where N may be any value greater than one, the N inductors may have the same or different inductances. The coupling factors for the N inductors may be the same or different. The N capacitors coupled to the N inductors may also have the same or different capacitances. The N ports may have the same or different self-resonant frequencies. At least N different resonant frequencies may be obtained with N−1 switches coupled in series with N−1 inductors. If the N inductors have equal inductance so that $L_1=L_2=\ldots=L_N=L$, if the C capacitors also have equal capacitance so that $C_1=C_2=\ldots=C_N=C$, and if the coupling factors are equal so that $k_{ij}=k$ for any pair of inductors i, j, then N different resonant frequencies may be obtained by selectively controlling the N−1 switches. If different inductances, capacitances, and/or coupling factors are used for different ports, then more than N different resonant frequencies may be obtained by selectively closing different combinations of the N−1 switches.

For the embodiments described above, each secondary port has at least one capacitor coupled in series with an inductor via at least one switch. Other circuit elements may also be coupled in the primary and secondary ports. For example, a negative resistance generator (e.g., an amplifier) may be used in each of one or more secondary ports. Each negative resistor may be selectively turned on and off, and may serve as the switch for the port. Each secondary port with an enabled negative resistor is able to oscillate by itself. In this case, multiple oscillators may be formed in multiple ports, and these oscillators are coupled via the coupled inductors. Different secondary ports may be enabled and disabled to achieve different resonant frequencies.

For a VCO employing a resonator with N coupled inductors, where N≧2, coarse tuning may be performed to enable and disable the proper combination of ports such that the center or nominal frequency of the VCO is as close to the desired frequency as possible. Fine tuning may then be performed to enable and disable the proper combination of switchable capacitors (if any) in the enabled port(s) such that the nominal frequency of the VCO is closer to the desired frequency. A phase locked loop (PLL) may then be used to lock the VCO to the desired frequency by adjusting the varactor(s) in the enabled port(s).

The inductors for a coupled-inductor based resonator may be implemented in various manners. For example, the inductors may be formed with metal conductors on an IC die or a printed circuit board (PCB). The inductors may also be implemented with discrete or hybrid components.

Figure 8:
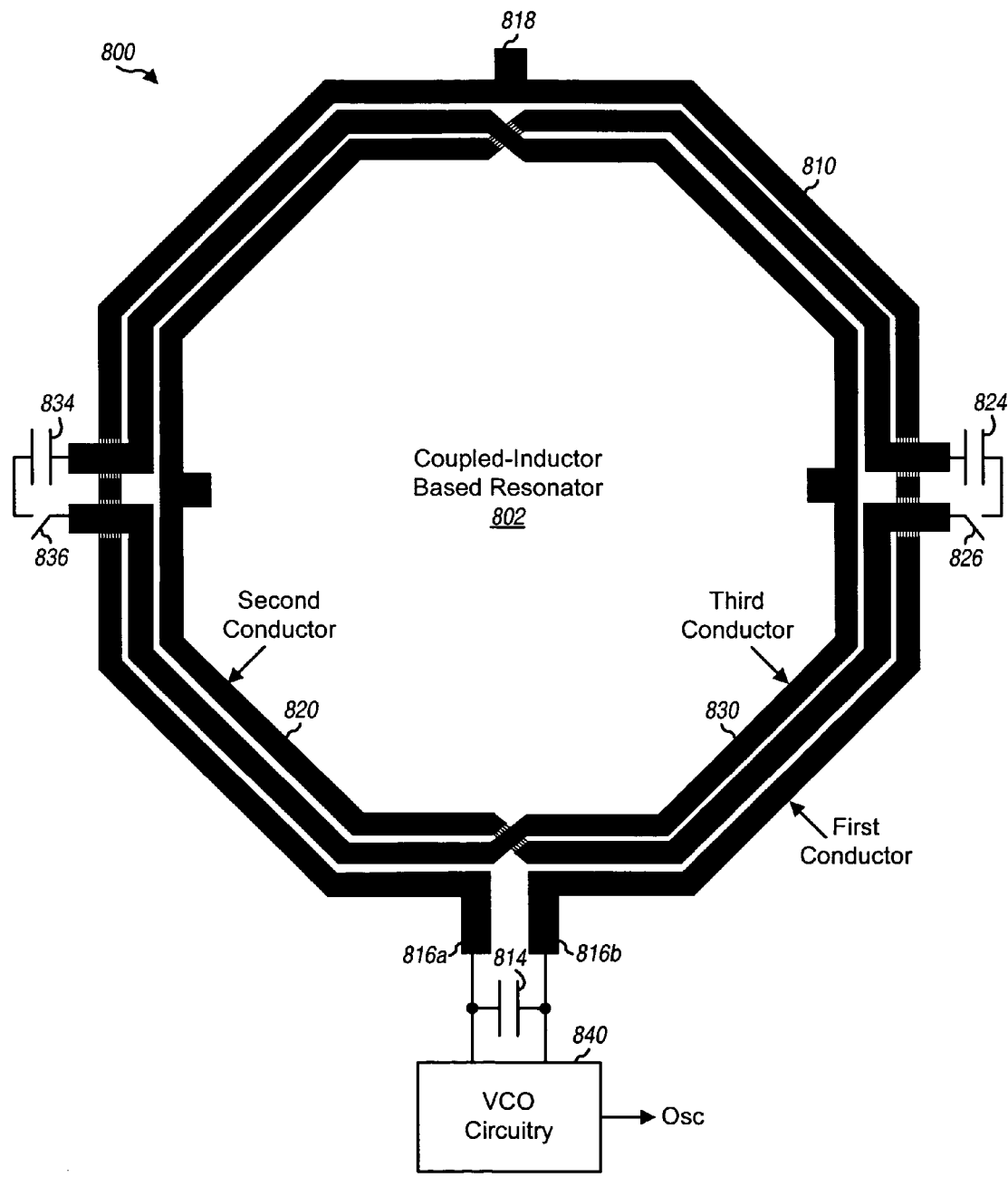
FIG. 8 shows a VCO with three coupled inductors formed with three conductors.

FIG. 8 shows a VCO 800 with a coupled-inductor based resonator 802 having three coupled inductors 810, 820 and 830 for three ports. For this embodiment, inductor 810 is formed with a first conductor, inductor 820 is formed with a second conductor, and inductor 830 is formed with a third conductor. The first, second, and third conductors are formed in three spirals such that (1) the first conductor is adjacent to the second conductor for the right half of the spiral and is adjacent to the third conductor for the left half of the spiral and (2) the second and third conductors are adjacent to each other for the entire spiral. The three conductors may also be formed in other manners. For example, the second conductor may be formed adjacent to and inside of the first conductor, and the third conductor may be formed adjacent to and outside of the first conductor. This alternate layout would result in a higher coupling factor $k_{12}$ for the first and second conductors, a higher coupling factor $k_{13}$ for the first and third conductors, but a lower coupling factor $k_{23}$ for the second and third conductors.

A capacitor 814 is coupled across the first conductor at nodes 816a and 816b, which further connect to VCO circuitry 840. A capacitor 824 and a switch 826 are coupled in series with the second conductor for the second port. A capacitor 834 and a switch 836 are coupled in series with the third conductor for the third port. VCO circuitry 840 includes all of the circuitry needed to generate the oscillator signal (Osc) such as, for example, amplifier, capacitors, delay circuit, buffer, divider circuit, and so on.

To achieve a high quality factor (Q), the three conductors may be fabricated entirely (or almost entirely) on a low-loss metal layer (e.g., copper), except for any underpass to interconnect sections of the same conductor. The first conductor for inductor 810 may be formed entirely on the low-loss metal layer in order to achieve low-loss. A 'tap' pin 818 is the center tap of inductor 810 and may be coupled to a power supply voltage, which can then provide the voltage used by circuit components (e.g., varactors) coupled to the first conductor. Taps are also formed in the second and third conductors for inductors 820 and 830, respectively, and may be used if needed.

FIG. 8 shows a specific embodiment of three inductors 810, 820 and 830. In general, the desired inductance for each inductor may be obtained by selecting an appropriate pattern (e.g., spiral, double spiral, zig-zag, and so on) and controlling the width, height, and/or other attributes of the conductor. Different coupling factors may be obtained by controlling the placement of the conductors and/or the distance between the conductors. The conductors may be fabricated with various types of conductive material such as a low-loss metal (e.g., copper), a more lossy metal (e.g., aluminum), or some other material. Higher Q may be achieved if the conductor is fabricated with a low-loss metal. A smaller-size inductor may be fabricated on a lossy metal layer because different design rules may apply. The conductors for the inductors may all be fabricated on the same layer (as shown in FIG. 8) or on different layers (e.g., to obtain stacked inductors). Different layouts and fabrication techniques (including Micro-Electro-Mechanical Systems (MEMS) technologies) may provide different advantages.

The switches to enable and disable the inductors/ports may be placed anywhere in the secondary ports. For example, the switch for a secondary port may be placed next to the capacitor, near the inductor, or even between two sections (e.g., in the center tap) of the inductor. The switches may also be implemented in various manners. For example, the switches may be implemented with N-channel metal-oxide semiconductor (N-MOS) transistors, P-channel MOS (P-MOS) transistors, bipolar junction transistors (BJTs), Gallium Arsenide (GaAs) transistors, MEMS devices, and so on. The switches may be fabricated on an IC chip with the same IC technology used to fabricate active elements (e.g., transistors). The switches may also be implemented with discrete components or using MEMS technologies. The implementation of the switches is generally not critical, but the losses of the switches should be kept low to reduce their impact on the electrical characteristics of the coupled-inductor based resonator.

The coupled-inductor based resonator may be used for various types of oscillators such as VCOs, current controlled oscillators (ICOs), voltage controlled crystal oscillators (VCXOs), and so on. The coupled-inductor based resonator may also be used with various oscillator topologies. Several exemplary VCO designs are described below.

Figure 9:
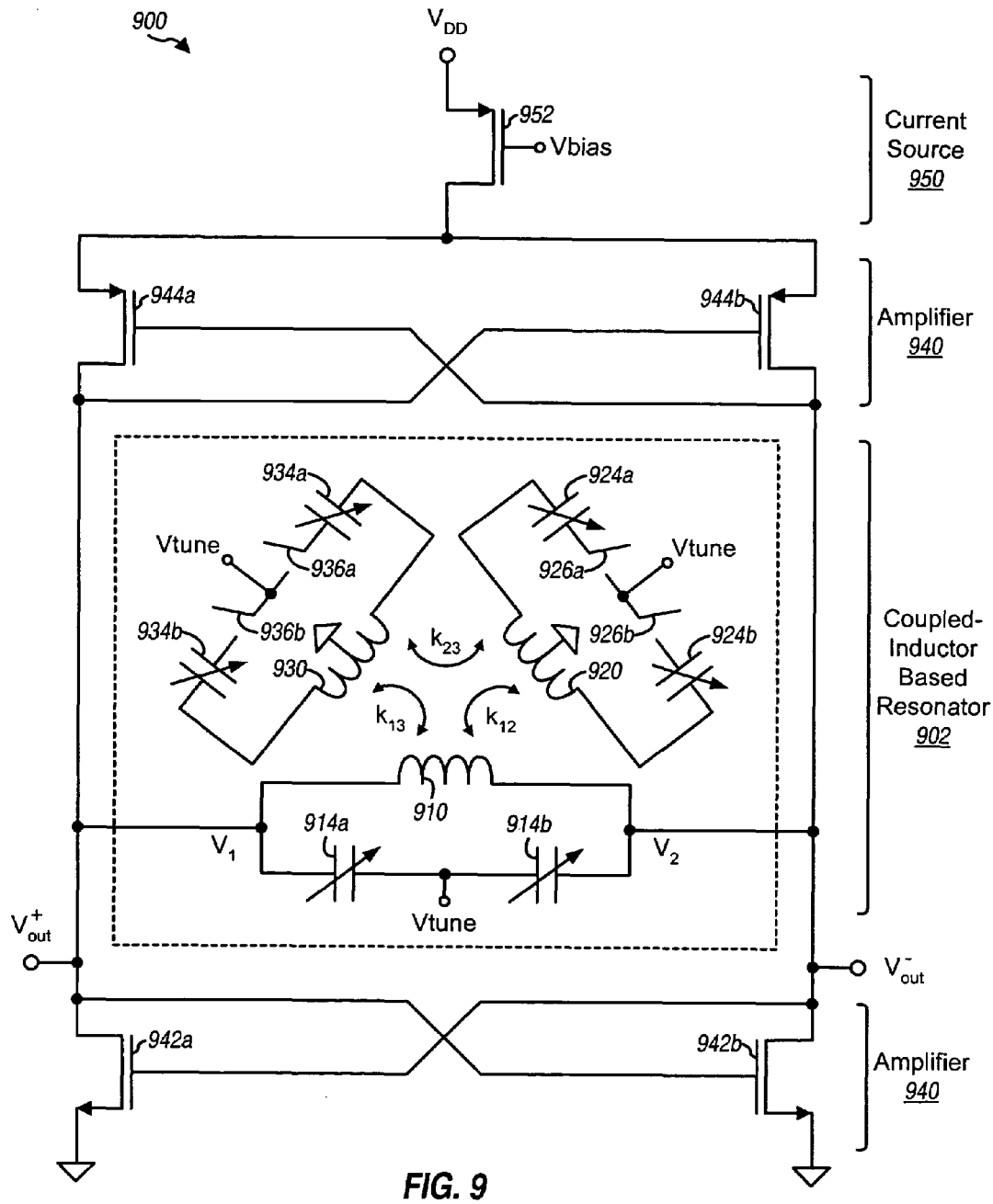
FIG. 9 shows a complementary cross-pair oscillator with a resonator having three coupled inductors.

FIG. 9 shows a schematic diagram of a VCO 900, which is implemented as a complementary cross-pair oscillator. VCO 900 includes a coupled-inductor based resonator 902 having three coupled inductors, an amplifier 940, and a current source 950. Current source 950 includes a P-MOS transistor 952 having its source coupled to a power supply, VDD, its gate receiving a bias voltage $V_{bias}$, and its drain providing a reference current. Amplifier 940 is composed of N-MOS transistors 942a and 942b and P-MOS transistors 944a and 944b. Transistors 942a and 944a form a first inverter, and transistors 942b and 944b form a second inverter. Transistor 942a has its source coupled to circuit ground, its drain coupled to the drain of transistor 944a, and its gate coupled to a node $V_{out}^-$. Transistor 944a has its source coupled to the drain of transistor 952 and its gate coupled to node $V_{out}^-$. Transistors 942b and 944b are coupled in similar manner as transistors 942a and 944a. Nodes $V_{out}^-$ and $V_{out}^+$ represent the input and output, respectively, of the first inverter. Nodes $V_{out}^+$ and $V_{out}^-$ also represent the input and output, respectively, of the second inverter. The first and second inverters are thus cross-coupled. Nodes $V_{out}^+$ and $V_{out}^-$ also represent the differential output of VCO 900.

Coupled-inductor based resonator 902 has three ports. For the first port, an inductor 910 couples between nodes $V_1$ and $V_2$, and varactors 914a and 914b couple in series and also between nodes $V_1$ and $V_2$. For the second port, an inductor 920 couples in series with varactors 924a and 924b and switches 926a and 926b. For the third port, an inductor 930 couples in series with varactors 934a and 934b and switches 936a and 936b. The center taps of inductors 920 and 930 are coupled to circuit ground. A control voltage ($V_{tune}$) is provided to varactors 914a, 914b, 924a, 924b, 934a and 934b and used to adjust the capacitance of these varactors. In general, each of the three ports for resonator 902 may include any number and any combination of fixed capacitors, switchable capacitors, and varactors.

Figure 10:
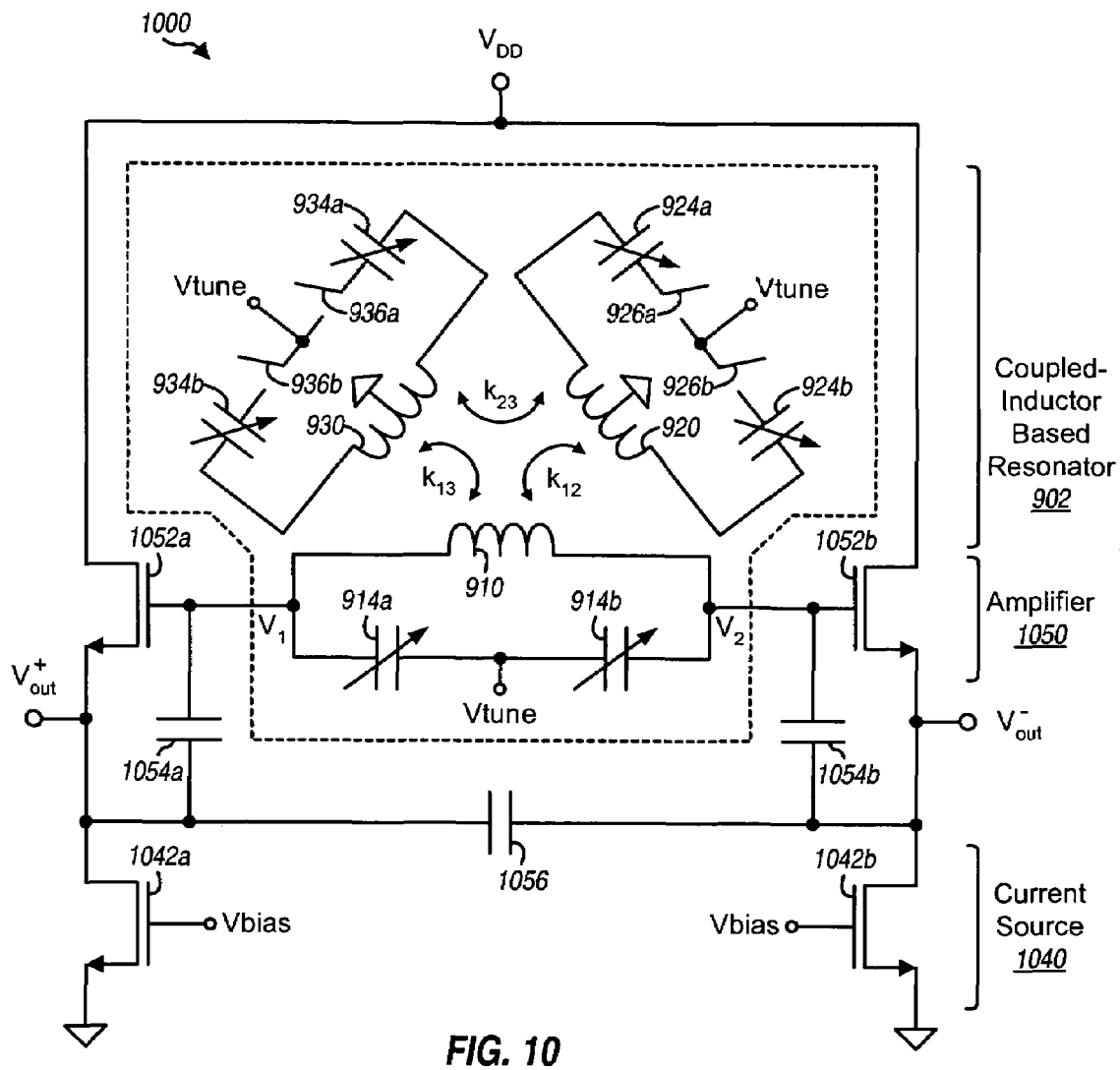
FIG. 10 shows a Colpitts oscillator with a resonator having three coupled inductors.

FIG. 10 shows a schematic diagram of a VCO 1000, which is implemented as a Colpitts oscillator. VCO 1000 includes coupled-inductor based resonator 902 having three coupled inductors, a current source 1040, and an amplifier 1050. Current source 1040 includes N-MOS transistors 1042a and 1042b having their sources coupled to circuit ground, their gates receiving a bias voltage $V_{bias}$, and their drains coupled to nodes $V_{out}^+$ and $V_{out}^-$, respectively. Amplifier 1050 includes N-MOS transistors 1052a and 1052b having their sources coupled to nodes $V_{out}^+$ and $V_{out}^-$, respectively, and their drains coupled to the supply voltage, $V_{DD}$. Coupled-inductor based resonator 902 is implemented as described above, and nodes $V_1$ and $V_2$ of resonator 902 couple to the gates of transistors 1052a and 1052b, respectively. A capacitor 1054a couples between the gate and source of transistor 1052a, a capacitor 1054b couples between the gate and source of transistor 1052b, and a capacitor 1056 couple between output nodes $V_{out}^+$ and $V_{out}^-$.

The VCO and coupled-inductor based resonator described herein may be employed in various systems and applications such as communication, networking, computing, consumer electronics, and so on. For example, the VCO and coupled-inductor based resonator may be used in wireless communication systems such as a Code Division Multiple Access (CDMA) system, a Time Division Multiple Access (TDMA) system, a Global System for Mobile Communications (GSM) system, an Advanced Mobile Phone System (AMPS) system, Global Positioning System (GPS), a multiple-input multiple-output (MIMO) system, an orthogonal frequency division multiplexing (OFDM) system, an orthogonal frequency division multiple access (OFDMA) system, a wireless local area network (WLAN), and so on. The use of the VCO and coupled-inductor based resonator for wireless communication is described below.

Figure 11:
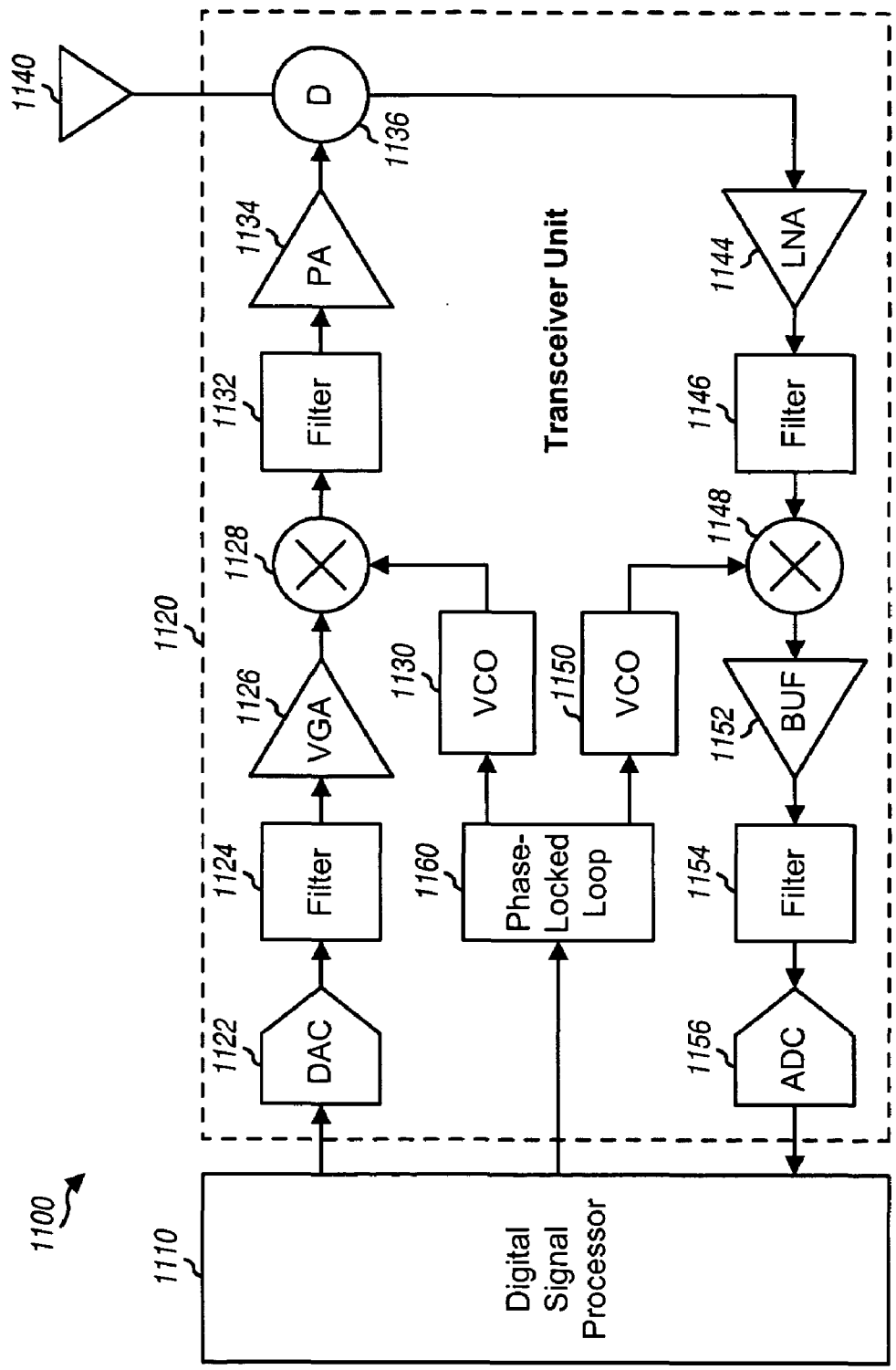
FIG. 11 shows a wireless device used for wireless communication.

FIG. 11 shows a block diagram of a wireless device 1100 that may be used for wireless communication. Wireless device 1100 may be a cellular phone, a terminal, a handset, a subscriber unit, or some other device or design. Wireless device 1100 is capable of providing bidirectional communication via a transmit path and a receive path.

On the transmit path, a digital signal processor (DSP) 1110 processes data to be transmitted and provides a stream of chips to a transceiver unit 1120. Within transceiver unit 1120, one or more digital-to-analog converters (DACs) 1122 convert the stream of chips to one or more analog signals. The analog signal(s) are filtered by a filter 1124, amplified by a variable gain amplifier (VGA) 1126, and frequency upconverted from baseband to RF by a mixer 1128 to generate an RF signal. The frequency upconversion is performed with an upconversion LO signal from a VCO 1130. The RF signal is filtered by a filter 1132, amplified by a power amplifier (PA) 1134, routed through a duplexer (D) 1136, and transmitted from an antenna 1140.

On the receive path, an RF input signal is received by antenna 1140, routed through duplexer 1136, amplified by a low noise amplifier (LNA) 1144, filtered by a filter 1146, and frequency downconverted from RF to baseband by a mixer 1148 with a downconversion LO signal from a VCO 1150. The downconverted signal is buffered by a buffer 1152, filtered by a filter 1154, and digitized by one or more analog-to-digital converters (ADCs) 1156 to obtain one or more streams of samples. The sample stream(s) are provided to DSP 1110 for processing.

FIG. 11 shows a specific transceiver design. In a typical transceiver, the signal conditioning for each path may be performed by one or more stages of amplifier, filter, mixer, and so on, as is known in the art. FIG. 11 only shows some of the circuit blocks that may be used for signal conditioning.

For the embodiment shown in FIG. 11, transceiver unit 1120 includes two VCOs 1130 and 1150 for the transmit and receive paths, respectively. A phase locked loop (PLL) 1160 receives control information from DSP 1110 and provides controls for VCOs 1130 and 1150 to generate the proper upconversion and downconversion LO signals, respectively. VCOs 1130 and 1150 may be implemented with various VCO designs and may employ the coupled-inductor based resonator described herein. For example, VCOs 1130 and 1150 may each be implemented as shown in FIG. 9 or 10. Each VCO may also be designed to operate at an integer or non-integer multiple of one or more frequency bands. Table 1 lists some frequency bands commonly used for wireless communication.

TABLE 1

| Frequency Band | Frequency Range |
| --- | --- |
| Personal Communication System (PCS) | 1850 to 1990 MHz |
| Cellular | 824 to 894 MHz |
| Digital Cellular System (DCS) | 1710 to 1880 MHz |
| GSM900 | 890 to 960 MHz |
| International Mobile Telecommunications-2000 (IMT-2000) | 1920 to 2170 MHz |
| CDMA450 | 411 to 493 MHz |
| JCDMA | 832 to 925 MHz |
| KPCS | 1750 to 1870 MHz |
| Global Positioning System (GPS) | 1574.4 to 1576.4 MHz |

The coupled-inductor based resonator described herein may also be used for other circuit blocks besides VCO. For example, the coupled-inductor based resonator may be used for multi-band or tunable filters, impedance matching networks, and so on.

The VCO and coupled-inductor based resonator described herein may be fabricated with various IC process technologies such as N-MOS, P-MOS, CMOS, BJT, GaAs, and so on. The VCO and coupled-inductor based resonator may also be fabricated on various types of ICs such as RFICs, analog ICs, digital ICs, mixed-signal ICs, MEMS devices, and so on.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
a resonator having a plurality of ports, each port comprising an inductor and at least one capacitor, wherein a plurality of inductors for the plurality of ports are magnetically coupled, wherein the resonator comprises at least three ports; and
an amplifier coupled to the resonator and operable to generate an output signal having a frequency determined by the resonator.

2. The apparatus of claim 1, wherein the resonator and the amplifier are configurable to operate at a plurality of frequency bands.

3. The apparatus of claim 1, wherein the plurality of ports are selectively enabled and disabled to vary the frequency of the output signal.

4. The apparatus of claim 1, wherein each port for at least one of the plurality of ports comprises at least one switch operable to selectively connect and disconnect the at least one capacitor for the port.

5. The apparatus of claim 1, wherein each port for at least one of the plurality of ports comprises a variable capacitor among the at least one capacitor for the port.

6. The apparatus of claim 1, wherein the plurality of inductors have approximately equal inductances.

7. The apparatus of claim 1, wherein the plurality of inductors have approximately equal coupling factors.

8. The apparatus of claim 1, wherein the plurality of ports have approximately equal capacitances.

9. The apparatus of claim 1, wherein the resonator and the amplifier are coupled as a cross-coupled oscillator.

10. The apparatus of claim 1, wherein the resonator and the amplifier are coupled as a Colpitts oscillator.

11. The apparatus of claim 1, wherein the plurality of inductors are formed with a plurality of metal conductors.

12. The apparatus of claim 11, wherein the plurality of metal conductors are fabricated on an integrated circuit (IC).

13. The apparatus of claim 11, wherein the plurality of metal conductors are fabricated on a printed circuit board (PCB).

14. An integrated circuit (IC) comprising:
a resonator having a plurality of ports, each port comprising an inductor and at least one switchable capacitor, the switchable capacitors allowing the resonator to achieve a continuous and wide range of resonant frequencies, wherein a plurality of inductors for the plurality of ports are magnetically coupled; and
an amplifier coupled to the resonator and operable to generate an output signal having a frequency determined by the resonator.

15. The integrated circuit of claim 14, wherein the amplifier comprises at least one metal-oxide semiconductor (MOS) transistor, at least one bipolar junction transistor (BJT), or at least one Gallium Arsenide (GaAs) transistor.

16. The integrated circuit of claim 14, wherein the plurality of inductors are formed with a plurality of metal conductors on the IC.

17. The integrated circuit of claim 16, wherein the plurality of metal conductors are fabricated with a low-loss metal.

18. The integrated circuit of claim 16, wherein the plurality of metal conductors are fabricated on a single layer of the IC.

19. The integrated circuit of claim 14, wherein the resonator and the amplifier are configurable to operate at a plurality of frequency bands by selectively enabling and disabling the plurality of ports of the resonator.

20. The integrated circuit of claim 14, wherein the resonator and the amplifier are configurable to achieve a continuous band of operation by selectively enabling and disabling the plurality of ports of the resonator.

21. An apparatus in a wireless communication system, comprising:
means for forming a plurality of resonator tanks that are magnetically coupled;

means for selectively enabling and disabling switchable capacitors in the plurality of resonator tanks to achieve a continuous and wide range of resonant frequencies; and means for amplifying a signal from at least one enabled resonator tank to generate an output signal having a frequency determined by the at least one enabled resonator tank.

22. The apparatus of claim 21, further comprising:
means for adjusting capacitance of the at least one enabled resonator tank to vary the frequency of the output signal.

23. A wireless device in a wireless communication system, comprising:
a resonator having a plurality of ports, each port comprising an inductor and at least one capacitor, wherein a plurality of inductors for the plurality of ports are magnetically coupled, wherein the resonator comprises at least three ports; and
an amplifier coupled to the resonator and operable to generate an output signal having a frequency determined by the resonator.

24. The wireless device of claim 23, wherein the output signal is used for frequency downconversion of a radio frequency (RF) input signal.

25. The wireless device of claim 23, wherein the output signal is used for frequency upconversion of a baseband input signal.

26. The wireless device of claim 23, wherein the resonator and the amplifier are configurable to operate at a plurality of frequency bands by selectively enabling and disabling the plurality of ports of the resonator.

27. The wireless device of claim 26, wherein the plurality of frequency bands include a cellular band and a Personal Communication System (PCS) band.

28. The wireless device of claim 23, wherein the resonator and the amplifier are configurable to generate the output signal used for frequency conversion for at least two different wireless communication standards.

29. The wireless device of claim 28, wherein the at least two different wireless communication standards include cdma2000 and Wideband-CDMA (W-CDMA).

30. A method of generating an oscillator signal, comprising:
identifying a selected frequency band from among a continuous and wide range of resonant frequencies;
selectively enabling and disabling switchable capacitors in a plurality of ports of a resonator based on the selected frequency band; and
generating the oscillator signal for the selected frequency band with the resonator.

31. The method of claim 30, wherein selectively enabling switchable capacitors in the ports of the resonator comprises enabling at least one capacitor in all ports simultaneously.

32. The method of claim 30, wherein selectively disabling switchable capacitors in the ports of the resonator comprises disabling at least one capacitor in all ports simultaneously.

* * * * *